(12) United States Patent
Le et al.

(10) Patent No.: US 6,420,206 B1
(45) Date of Patent: Jul. 16, 2002

(54) OPTICAL MEMBRANE SINGULATION PROCESS UTILIZING BACKSIDE AND FRONTSIDE PROTECTIVE COATING DURING DIE SAW

(75) Inventors: Minh Van Le, Methuen; Jo-Ey Wong, Brookline, both of MA (US)

(73) Assignee: Axsun Technologies, Inc., Billerica, MA (US)

( * ) Notice: Subject to any disclaimer, the term of this patent is extended or adjusted under 35 U.S.C. 154(b) by 0 days.

(21) Appl. No.: 09/774,216

(22) Filed: Jan. 30, 2001

(51) Int. Cl.[7] .................. H01L 21/00; H01L 21/301
(52) U.S. Cl. ................. 438/68; 216/2; 438/465
(58) Field of Search .................... 216/2; 438/465, 438/33, 68, 460

(56) References Cited

U.S. PATENT DOCUMENTS

| 3,699,644 A | 10/1972 | Cocca .................. 438/465 |
| 4,016,855 A | 4/1977 | Mimata ................ 125/13.01 |
| 4,387,145 A | 6/1983 | Lehrer et al. ............. 216/12 |
| 5,306,370 A | 4/1994 | Herko et al. ............. 156/155 |
| 5,362,681 A | 11/1994 | Roberts, Jr. et al. ...... 438/464 |
| 5,516,728 A | 5/1996 | Degani et al. ............ 438/465 |
| 5,573,679 A | 11/1996 | Mitchell et al. .............. 216/2 |
| 5,593,926 A | 1/1997 | Fujihira .................... 438/114 |
| 5,597,767 A | 1/1997 | Mignardi et al. ............ 438/14 |
| 5,622,900 A | 4/1997 | Smith ...................... 438/464 |
| 5,632,667 A | 5/1997 | Earl et al. .................. 451/41 |
| 5,832,585 A | 11/1998 | Takiar et al. ................ 29/424 |
| 5,904,546 A | 5/1999 | Wood et al. ............... 438/460 |
| 5,923,995 A | 7/1999 | Kao et al. ................. 438/460 |

OTHER PUBLICATIONS

Luxbacher, Thomas and Mirza, Andy, Spray Coating for MEMS and Advanced Packaging, HDI, May 1991.

*Primary Examiner*—Michael J. Sherry
*Assistant Examiner*—Evan Pert
(74) *Attorney, Agent, or Firm*—Grant Houston

(57) ABSTRACT

A process for singulating MOEMS optical devices from a precursor structure, in which the precursor structure comprises device material, having movable optical structures, and handle material, through which optical ports are formed to provide for optical access to the movable optical structures. The process comprises coating a frontside and a backside of the precursor structure with protection material. The precursor structure is then attached to a substrate such as dicing tape and the precursor structure separated into individual optical devices by a process, including die sawing. Thereafter, the optical devices are removed from the tape and the protection material removed from the optical devices.

16 Claims, 8 Drawing Sheets

OPTICAL MEMBRANE SINGULATION PROCESS UTILIZING BACKSIDE AND FRONTSIDE PROTECTIVE COATING DURING DIE SAW

BACKGROUND OF THE INVENTION

Micro electromechanical systems (MEMS), and specifically, microoptical electromechanical systems (MOEMS), are typically fabricated at the wafer and/or sub-wafer level. Hundreds of devices are typically manufactured on a single 4-inch or 6-inch wafer, for example. Sometimes these wafers are cut into multi-device coupons for further processing before the MOEMS optical devices are finally singulated into the individual device dies.

Because MEMS devices typically include cantilevered features and/or deflectable surfaces, provisions must be made for protecting devices during the singulation process. Singulation is a relatively violent process that typically includes sawing and/or cleaving a precursor structure comprising multiple MEMS devices into individual MEMS device dies. These steps of sawing and cleaving, and possibly etching, produce particulate matter that can interfere with the operation of the MEMS devices.

Various strategies have been proposed for protecting MEMS devices, such as accelerometers during singulation. The strategies typically combine a combination of frontside and/or backside sawing and/or etching. Sometimes water-soluble protective coatings are deposited over the MEMS structure and then later partially removed during a die sawing process. In still other examples, special two-layer dicing tape systems are used that encapsulate the MEMS structure for the die sawing process.

SUMMARY OF THE INVENTION

Existing singulation technology assumes that the MEMS device structure is only present on one side of the precursor structure. This is true for common MEMS accelerometers. For MOEMS devices, however, this assumption can sometimes be invalid. Optical ports are sometimes desirable or required through the backside of the MOEMS device to provide for transmission through the device. Existing singulation technology does not address this device configuration, since the particulate can enter the MOEMS device from both sides of the wafer. Moreover, attempts to perform some aspects of the singulation process prior to the release of the membrane, for example, yield new problems associated with electrostatic charge accumulation, during optical coating deposition, on electrically isolated device dies. This can result in membrane snap-on the handle wafer material and its stiction adhesion.

In general, according to one aspect, the present invention is directed to a process for singulating MOEMS optical devices from a precursor structure. This precursor structure comprises device material, in which movable optical structures are formed, and handle material, through which optical ports are formed to provide for optical access to the movable optical structures. The inventive process comprises coating a frontside and a backside of the precursor structure with protection material. The precursor structure is then attached to a substrate, which is typically a dicing tape, and the precursor structure separated into individual optical devices by a process, including die sawing. Thereafter, the optical devices are removed from the tape and the protection material removed from the optical devices.

In the preferred embodiment, the step of coating the frontside and the backside of the precursor structure comprises spraying the protection material on both the frontside and the backside of the structure. Preferably, a photoresist material is used, which is later removed by dissolving the photoresist layer in a bath. In one implementation, the bath is acetone. Also, circulation is preferably employed so that, as particulate matter is freed from the precursor structure due to the dissolving of the protection material, the particulate matter is swept away.

In the preferred embodiment, the precursor structure is separated into the individual optical devices by die sawing completely through the handle material and device material. In other implementations, however, die sawing is performed partially through the handle material and then cleaving through the remaining material to completely singulate the optical devices.

Also, according to the preferred embodiment, the dicing tape is UV (ultra-violet) curable, with the frontside and backside of the precursor structure being coated prior to attaching the precursor structure to the dicing tape. Consequently, the adhesion of the dicing tape is reduced through UV exposure. The singulated devices are then placed into a waffle pack jig for the subsequent removal of the protection material.

In general, according to another aspect, the invention also features a processing jig for singulated MOEMS devices. This jig has the form of a waffle pack comprising an array of cells for receiving singulated optical devices. A top is placed over the waffle pack to retain the MOEMS devices in their respective cells. Fluid ports are provided in each device cell for facilitating fluid circulation through the cells.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

Figure 1:
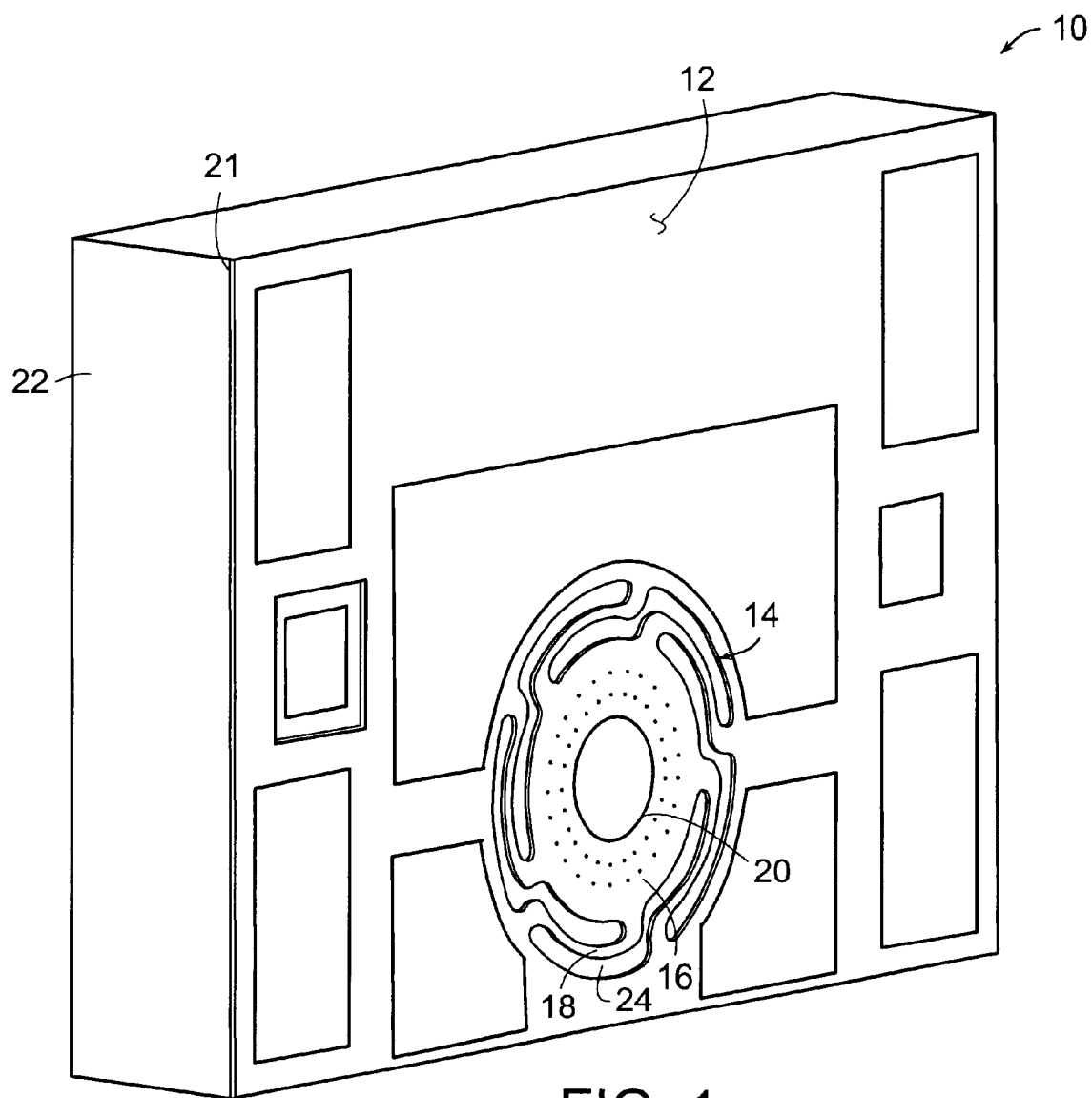
FIG. 1 is a perspective view of a MOEMS optical device including an optical membrane to which the present invention is applicable in one example.

FIG. 1 shows a frontside of a singulated MOEMS optical device 10 to which the present invention is applicable in one example.

Generally, the optical device comprises device material 12. A moveable optical structure 14 has been formed in this device material 12. Specifically, in the illustrated example, a deflectable membrane 16, i.e., the release structure, is capable of out-of-plane deflection.

The membrane 16 is attached to the remainder of the device material via tethers 18. In the illustrated example, a highly reflecting (HR) dot 20 is deposited at the center of the membrane 16. Device material 12 is provided on handle material 22 with an intervening sacrificial, insulating layer 21 that is removed from underneath the membrane 16 to provide for its release and consequent out-of-plane actuation.

The deflection of the membrane 14 is controlled by an electrostatic drive cavity between the device material 12 and the handle material 22.

Figure 2:
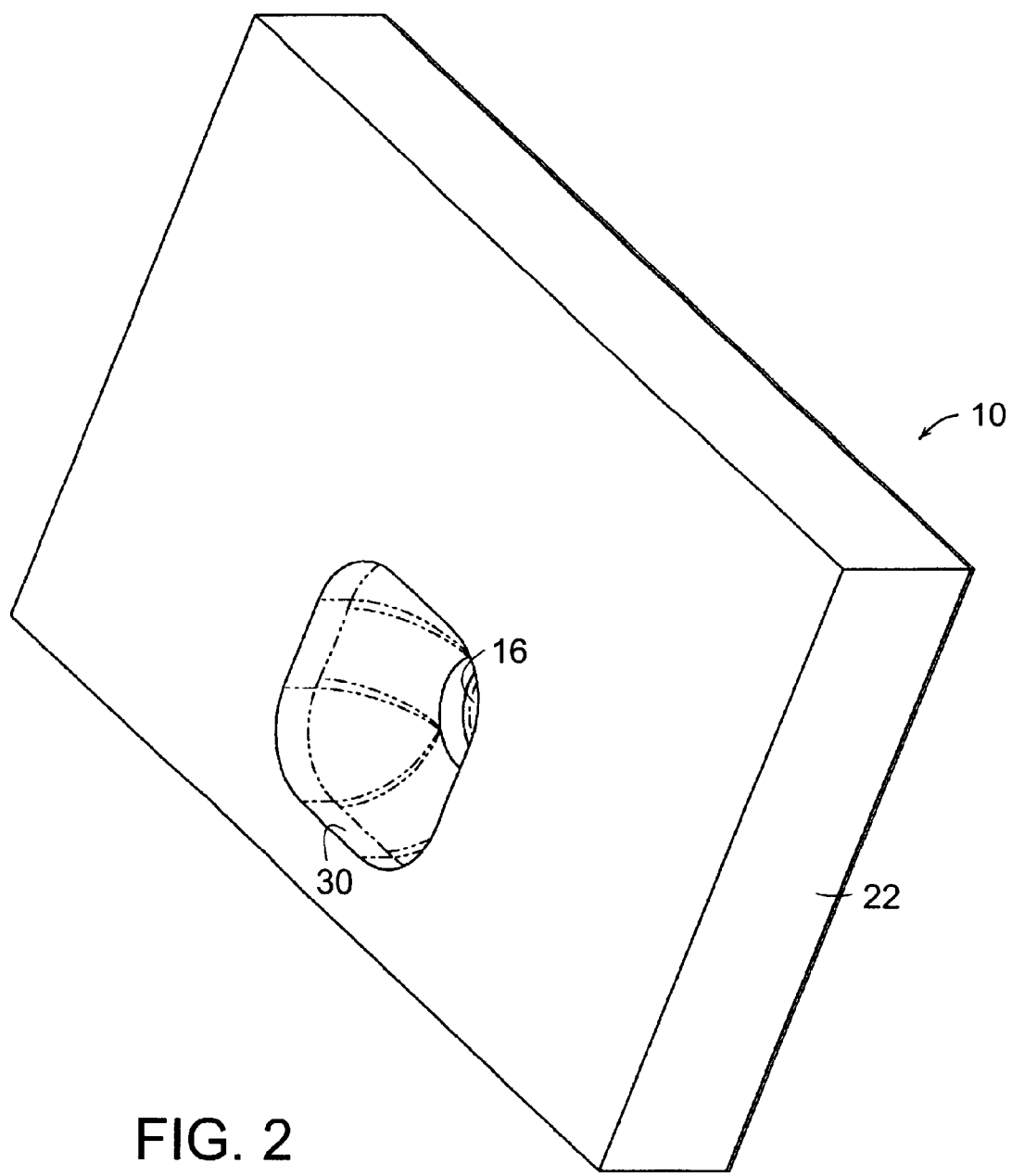
FIG. 2 is a perspective view showing the backside of the MOEMS optical device.

FIG. 2 shows the backside of the optical device 10. Specifically, an optical port 30 has been formed in the handle material 22. This optical port preferably extends all the way through the handle material 22 so that the optical membrane 16 can be observed from this backside view.

Figure 3:
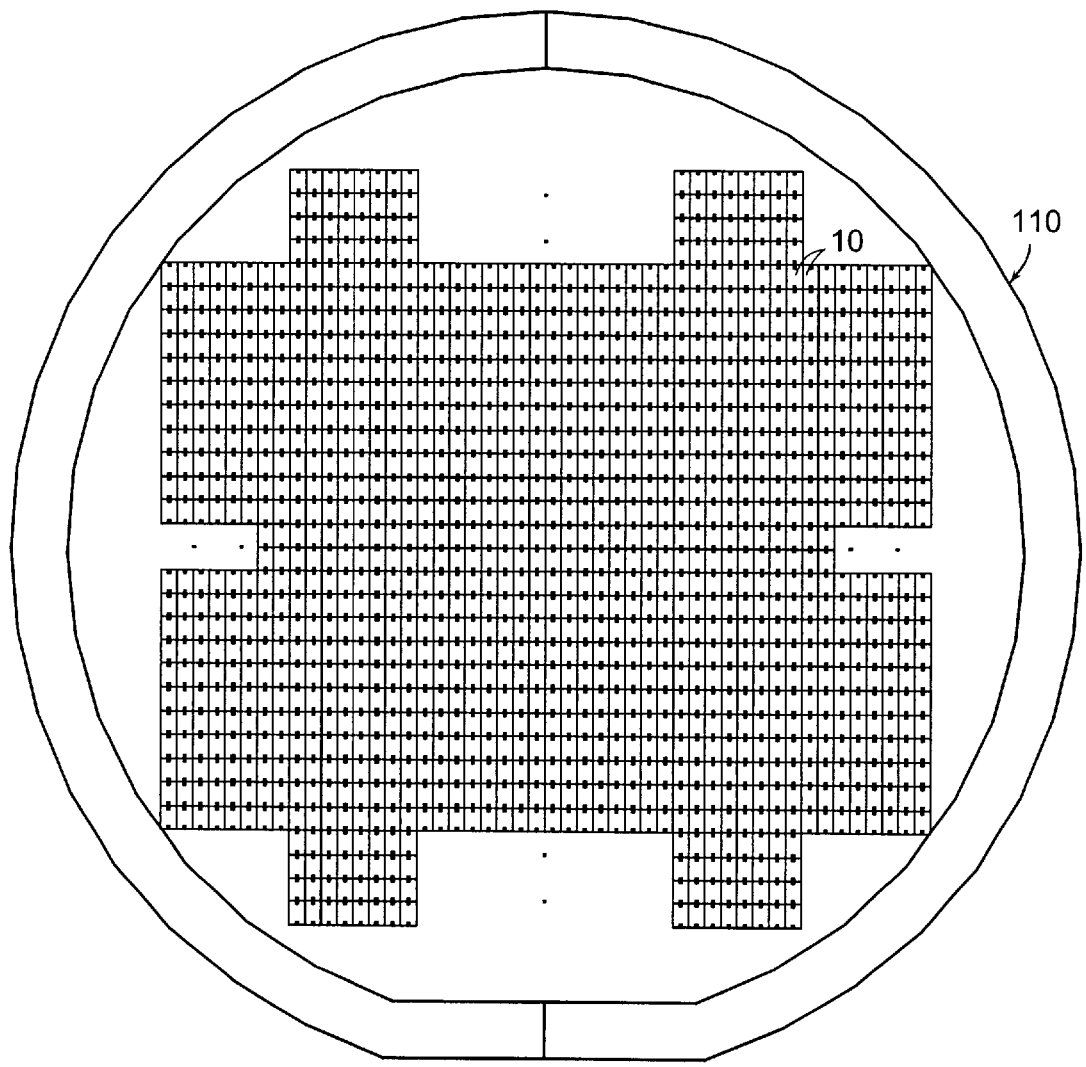
FIG. 3 is a plan view of a wafer precursor structure for MOEMS optical devices.

FIG. 3 shows a wafer precursor structure 110 on which multiple optical devices 10 are fabricated. In this example, multiple optical devices 10 are manufactured on a single wafer simultaneously.

Figure 4:
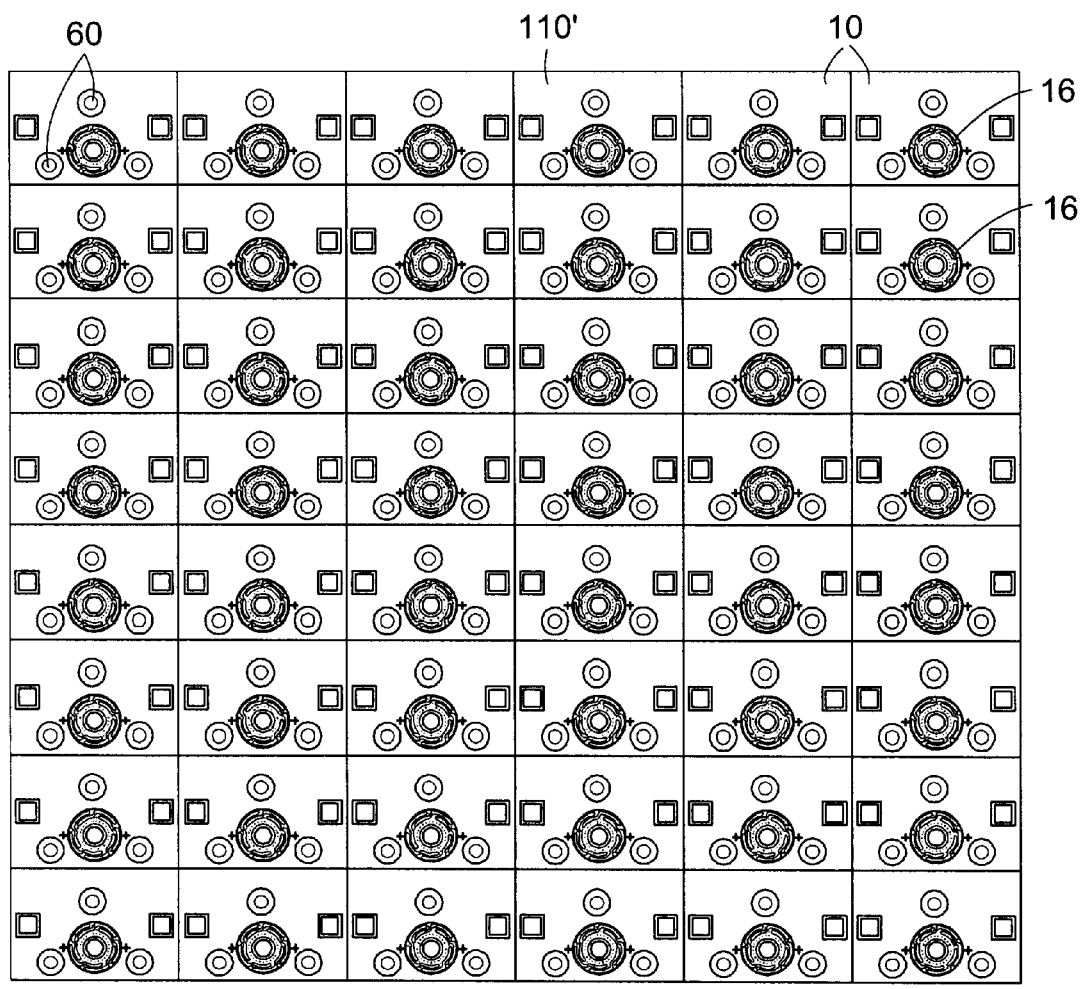
FIG. 4 is a top plan view showing coupon-level layout of the MOEMS optical devices on a precursor structure.

FIG. 4 shows a coupon-size portion 110' of the wafer. This view better shows the separate device dies 10 and their associated optical membranes 16. As shown, according to one feature, ball bumps or solder balls 60 have been added to each device die 10 at this wafer level process stage. These ball bumps 16 can be used to solder bond the individual devices 10 to mounting structures or alternatively to solder bond another optical device, such as a concave mirror to the device die 10 to form a Fabry-Perot filter, for example.

Figure 5:
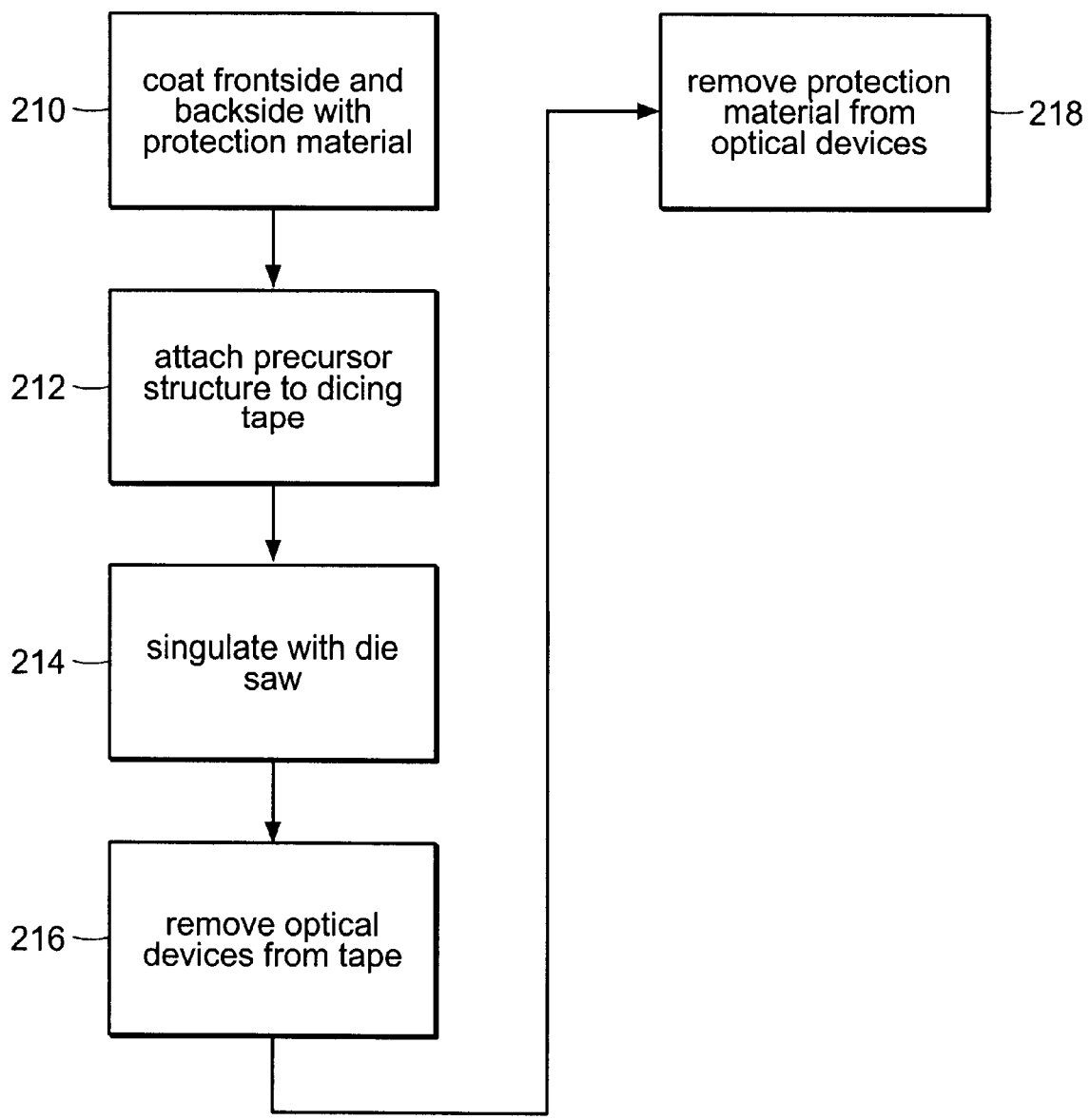
FIG. 5 is a flow diagram illustrating the inventive singulation process.

FIG. 5 is a process diagram illustrating the inventive process for singulating the optical devices.

Specifically, in step 210, the frontside and backside of the precursor structure 110, 110', containing the multiple optical devices are coated with a protection material. In the preferred embodiment, this protection material is a photo-resist.

Figure 6:
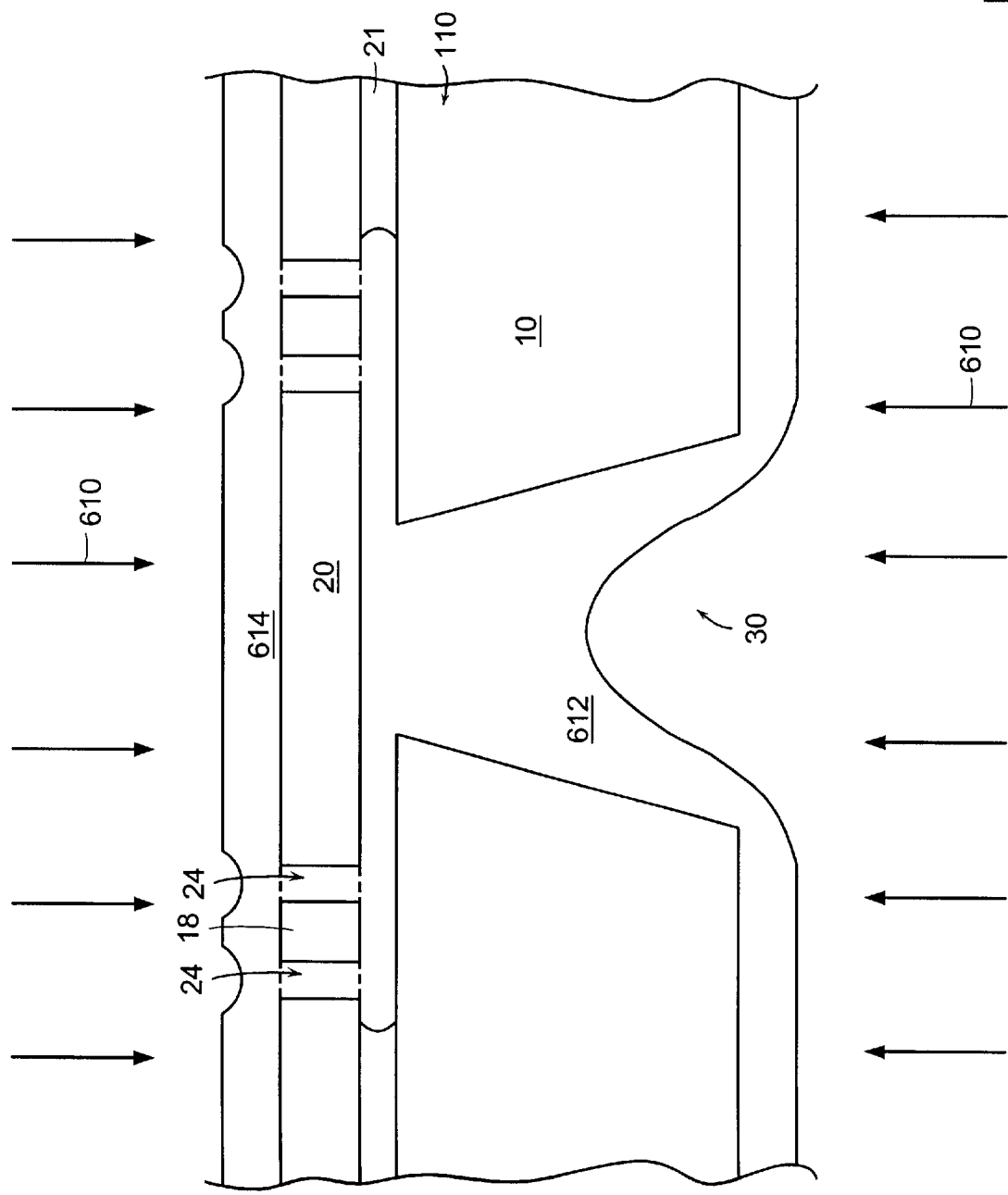
FIG. 6 is a schematic cross sectional view illustrating the backside and frontside coating of the MOEMS optical device with the protection material.

FIG. 6 shows the process of coating. In the preferred embodiment, the resist protection material 610 is sprayed on both sides of the precursor structure 110. Specifically, this photo-resist 610 forms a photo-resist layer 612 that fills into the optical ports 30 of the individual optical devices 10 from the backside. Further, the photo-resist on the frontside fills into voids 24 that define the flexures 18 or tethers and generally forms a frontside layer 614 that coats over the membrane 16 and the surrounding frontside features.

Returning to FIG. 5, after the step of coating the protection material on the frontside and backside, in the step 212, the precursor structure 110 is attached to dicing tape.

In the preferred embodiment, a UV curable dicing tape is used.

In step 214, the precursor structure 110, which is attached to the dicing tape, is then singulated into the separate optical devices 10. This is accomplished by die sawing completely through the handle material 22 and the device material 12. With current die saw technology, the devices can be singulated with kerfs that are located with an accuracy of +/−1.5 micrometers.

In step 216, the individual devices 10 are removed from the dicing tape, preferably by a pick-and-place machine. In some implementations, the adhesion between the dicing tape and the singulated optical devices are decreased by UV exposure of the dicing tape to reduce its adhesion.

Thereafter, in a final step, the protection material is removed from the singulated optical devices in step 218.

Figure 7:
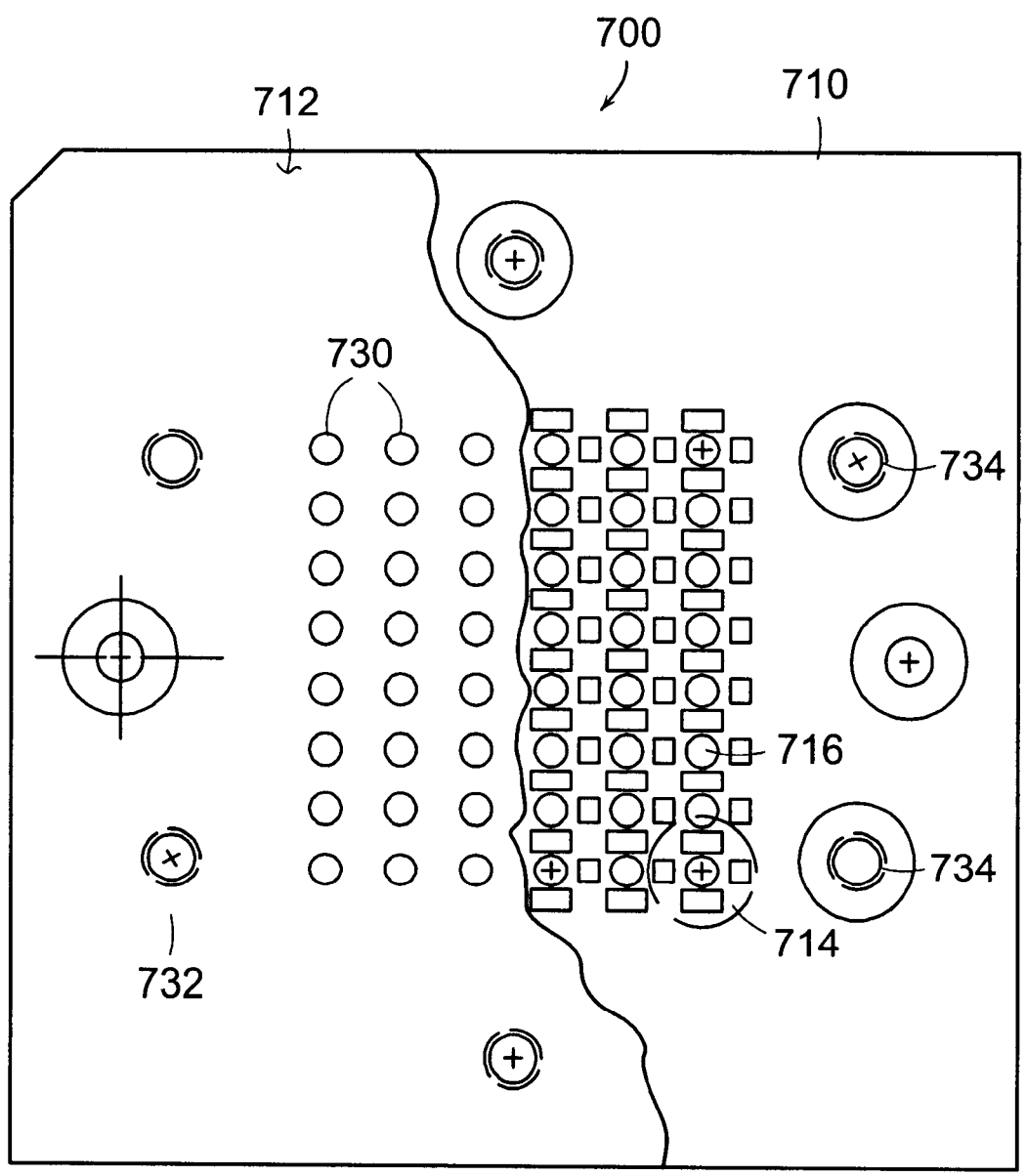
FIG. 7 is a top plan view with partial cut-away showing the processing jig for singulated MOEMS devices according to the present invention.

FIG. 7 shows a plan view of a processing jig 700 for singulated MOEMS devices. Specifically, the singulated optical devices 10 are placed into a processing jig where the protection material is preferably dissolved in a circulated bath in one implementation of step 218.

Specifically, in one embodiment, the processing jig 700 comprises a base 710 and a top 712. Specifically, the base portion 710 is in the form of a waffle pack, comprising an array of cells 714 for receiving individual, singulated MOEMS devices.

Figure 8:
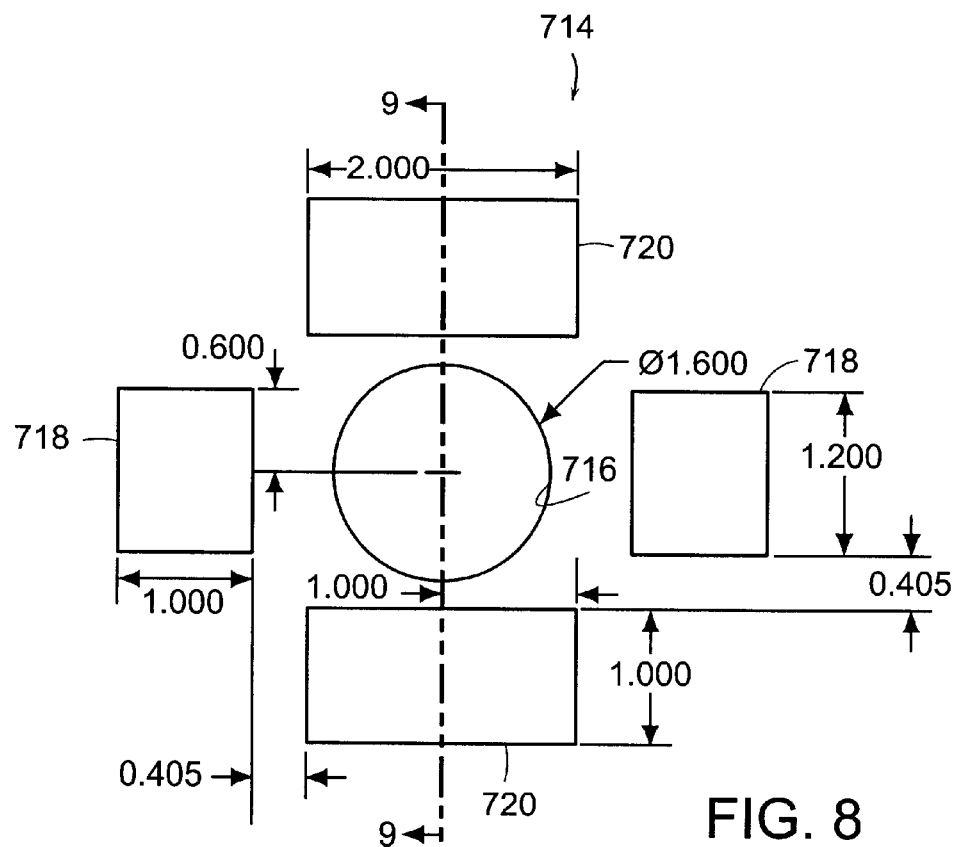
FIG. 8 is a detailed view of a cell for containing a singulated MOEMS device.

FIG. 8 shows the details of one of these cells 714. Specifically, the cell comprises a center port 716 that passes entirely through the waffle pack base 710. In the illustrated example, this port is 1.6 millimeters (mm) in diameter. Side retaining blocks 718 are located on either lateral side of the port 716. These retaining blocks 718 are approximately 1 mm wide and 1.2 mm tall in the illustrated implementation. Top and bottom retaining blocks 720 are provided above and below the fluid port 716. These top and bottom retaining blocks are approximately 2 mm wide and 1 mm in depth. Thus, the void of the cell that receives the device or chip 10 is less than 4 mm square or approximately 2.8 mm wide and 2.0 mm tall.

Figure 9:
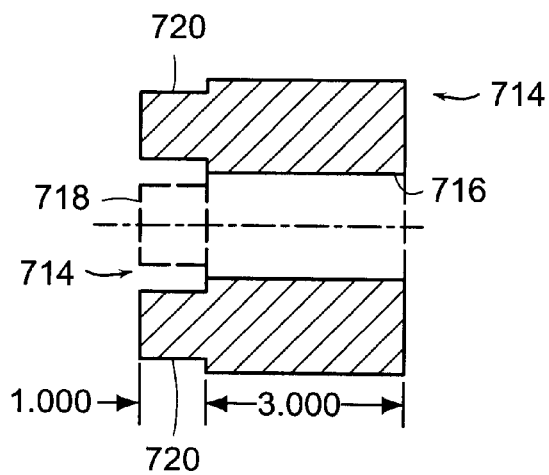
FIG. 9 is a cross-sectional view of this single device cell.

FIG. 9 is a cross sectional view of the exemplary cell 714 along line 9—9 of FIG. 8. Specifically, the view shows the port 716 and the cross-sections of the top and bottom retaining blocks 720.

In the preferred embodiment, the waffle top 712 has a corresponding array of fluid ports 730. The waffle top comprises registration holes 732 that mate with registration pins 734 on the waffle bottom 710 so that the fluid ports 730 of the top 712 are aligned over the fluid ports 716 of the base 710

Figure 10:
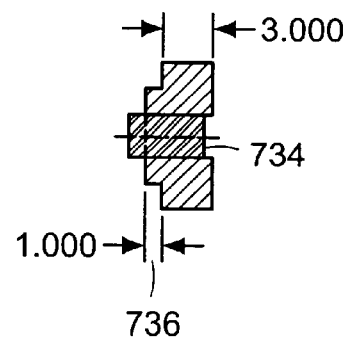
FIG. 10 is a pin for registration between the waffle pack base and the top.

FIG. 10 illustrates one of these registration pins 734. A 1 mm shoulder 736 surrounding the pins enables the waffle top 712 to be spaced away from the waffle bottom 710 by approximately one millimeter, which corresponds to the 1 mm height of the side and top block 718, 720.

As a result, when the singulated devices are separately placed in each one of the cells 714 and the top 712 secured on the waffle base 710, the devices are retained within their respective cells by the blocks 718, 720. Fluid ports 730 and 716, however, allow circulating acetone to attack the photoresist protection layer on the devices 10 while simultaneously allowing the acetone, containing any particulate matter, to be washed away.

Further, acetone circulates through lateral fluid ports that extend between the top 712 and the waffle bottom 710 and further between the blocks 718 and 720 thereby allowing effective particulate matter wash-out in the bath.

While this invention has been particularly shown and described with references to preferred embodiments thereof, it will be understood by those skilled in the art that various changes in form and details may be made therein without departing from the scope of the invention encompassed by the appended claims.

What is claimed is:

1. A process for singulating MOEMS optical devices from a precursor structure, which comprises device material, in which movable optical structures are formed, and handle material, through which optical ports are formed to provide optical access to the movable optical structures, the process comprising:

coating a frontside and a backside of the precursor structure with protection material;

attaching the precursor structure to a substrate;

separating the precursor structure into individual optical devices by a process including die sawing;

removing the optical devices from the substrate; and removing the protection material from the optical devices.

2. A MOEMS singulation process as claimed in claim 1, wherein the step of coating the frontside and the backside of the precursor structure comprises spraying the protection material on both the frontside and the backside of the precursor structure.

3. A MOEMS singulation process as claimed in claim 1, wherein the step of coating the frontside and the backside of the precursor structure comprises coating with a photoresist material.

4. A MOEMS singulation process as claimed in claim 3, wherein the step of removing the protection material comprises dissolving the photoresist material in a circulated bath.

5. A MOEMS singulation process as claimed in claim 4, wherein the bath contains acetone.

6. A MOEMS singulation process as claimed in claim 1, wherein the step of coating the frontside and the backside of the precursor structure comprises depositing protection material into the optical ports in the backside of the precursor substrate.

7. A MOEMS singulation process as claimed in claim 1, wherein the step of removing the protection material comprises dissolving the protection material.

8. A MOEMS singulation process as claimed in claim 1, wherein the step of separating the precursor structure into the individual optical devices comprises die sawing completely through the handle material and the device material.

9. A MOEMS singulation process as claimed in claim 1, wherein the step of separating the precursor structure into the individual optical devices comprises:

die sawing through the device material and partially through the handle material; and then cleaving the precursor structure into the individual optical devices.

10. A MOEMS singulation process as claimed in claim 1, wherein the substrate is dicing tape.

11. A MOEMS singulation process as claimed in claim 1, wherein the step of coating the frontside and the backside of the precursor structure is performed before the step of attaching the precursor structure to the substrate.

12. A MOEMS singulation process as claimed in claim 1, wherein the step of removing the optical devices from the substrate comprises manipulating the optical devices with a pick-and-place machine.

13. A MOEMS singulation process as claimed in claim 1, wherein the step of removing the optical devices from the substrate is performed after reducing a level of adhesion between the optical devices and the substrate.

14. A MOEMS singulation process as claimed in claim 13, further comprising exposing the substrate to ultraviolet light to reduce the adhesion.

15. A MOEMS singulation process as claimed in claim 1, wherein:

the step of removing the optical devices from the substrate comprises placing the optical devices into a waffle pack jig; and the step of removing the protection material from the optical devices comprises removing the protection material while the optical devices are in the waffle pack jig.

16. A MOEMS singulation process as claimed in claim 15, wherein the waffle pack jig comprises fluid ports in each device cell for facilitating removal of the protection material.

* * * * *